(12) United States Patent
Calderon

(10) Patent No.: US 6,388,893 B1
(45) Date of Patent: May 14, 2002

(54) FOAM CUSHION WITH CONDUCTIVE FOIL FOR GROUNDING IN AN EMI SHIELD AND METHOD OF USING THE SAME

(75) Inventor: Rafael Calderon, San Diego, CA (US)

(73) Assignees: Sony Corporation, Tokyo (JP); Sony Electronics, Park Ridge, NJ (US)

(*) Notice: Subject to any disclaimer, the term of this patent is extended or adjusted under 35 U.S.C. 154(b) by 0 days.

(21) Appl. No.: 09/343,257

(22) Filed: Jun. 30, 1999

Related U.S. Application Data
(60) Provisional application No. 60/116,766, filed on Jan. 22, 1999.

(51) Int. Cl.[7] .................................................. H05K 9/00
(52) U.S. Cl. ........................ 361/818; 361/816; 361/799; 174/35 R; 174/35 MS; 174/51; 156/313
(58) Field of Search ............................... 361/800, 799, 361/816, 818; 174/35 R, 35 GC, 35 MS, 51; 156/313, 281; 428/317.7, 319.1; 29/825, 886

(56) References Cited

U.S. PATENT DOCUMENTS

| | | | | |
|---|---|---|---|---|
| 5,105,056 A | * | 4/1992 | Hoge, Jr. et al. | 174/35 GC |
| 5,202,536 A | * | 4/1993 | Buonanno | 174/35 GC |
| 5,436,803 A | * | 7/1995 | Annis et al. | 361/818 |
| 5,597,979 A | * | 1/1997 | Courtney et al. | 174/35 R |
| 5,712,449 A | * | 1/1998 | Miska et al. | 174/35 GC |
| 5,804,762 A | * | 9/1998 | Jones et al. | 174/35 GC |
| 6,046,652 A | * | 4/2000 | Deiso, III et al. | 333/12 |

* cited by examiner

*Primary Examiner*—Jayprakash N. Gandhi
(74) *Attorney, Agent, or Firm*—Ronald P. Kananen, Esq.; Rader, Fishman & Grauer, PLLC

(57) ABSTRACT

A block of foam is wrapped with a conductive foil to replace a metal spring used to both support and ground an electrical component in an electronic device. In particular, the foam block wrapped in foil may be used to support a video board in a display device while grounding the EMI shielding on the board and related components. The foil is preferably adhered to the foam block with an adhesive.

22 Claims, 2 Drawing Sheets

FOAM CUSHION WITH CONDUCTIVE FOIL FOR GROUNDING IN AN EMI SHIELD AND METHOD OF USING THE SAME

This application claims priority from Provisional application Ser. No. 60/116,766, filed Jan. 22,1999.

FIELD OF THE INVENTION

The present invention relates to the field of display device manufacturing, such as the manufacture of a television set or a computer monitor. More particularly, the present invention relates to the field of grounding in an EMI shield for the video board of a display device such as a television set or monitor.

BACKGROUND OF THE INVENTION

Modern televisions and monitors are capable of processing high resolution video signals to display high quality images. Typically such display devices incorporate a cathode ray tube on which the video signal is displayed. However, video display devices also include liquid crystal arrays, projection systems and plasma display devices.

Most any of these display devices incorporate a circuit board called a video board. The video board contains the circuitry necessary to process the incoming video signals prior to display on the display device.

A pervasive problem with modern electronic devices, particularly video display devices, is electromagnetic interference (EMI). Electromagnetic interference is extraneous electromagnetic radiation that is emitted from a multitude of sources and interferes with the operation of electronic circuits such as those on a video board. The result can be a distortion of the picture or a decrease in picture quality. EMI may be emitted by an external source or by other components within the display device itself.

To prevent EMI from adversely affecting the operation of the circuits in the display device, particularly the video board, EMI shielding is incorporated into a television or monitor. The shielding disrupts or absorbs electromagnetic radiation before it can affect the operation of a shielded circuit.

Part of the EMI shielding is a path to ground that allows the dispersion of absorbed electromagnetic energy. In some conventional televisions, this path to ground is provided through a metal spring. The spring, typically made of copper, is used to both support the video board of the television and provide a path to ground from the EMI shielding of the video board.

However, when mass production is considered, the cost of providing and installing this metal spring becomes problematic. Consequently, there is a need in the art for an improved device and method for simultaneously providing a path to ground from EMI shielding and supporting a video board in a display device shielded by the EMI shielding. There is a further need in the art for this improved device to be relatively inexpensive and easy to manufacture and install so as to decrease the overall costs of manufacturing the display device.

SUMMARY OF THE INVENTION

It is an object of the present invention to meet the above-described needs and others. Specifically, it is an object of the present invention to provide a novel device and method for simultaneously supporting a video board and providing a path to ground from EMI shielding of that video board. It is a further object of the present invention that the device provided be relatively inexpensive and easy to manufacture and install.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied and described as a device for both supporting a component of an electronic device and providing and electrical pathway from that component. The device of the present invention includes a block of foam; and a conductive foil disposed on the block of foam for providing the desired electrical pathway. The foil is disposed on at least a portion of the top, bottom and three sides of the foam block. The conductive foil is preferably metal, for example, aluminum foil. The foam block is preferably made of urethane or the like.

Preferably, a layer of adhesive is applied between the foam and the foil for adhering the foil to the foam. The adhesive is provided on at least a top and bottom of the foam block. In a preferred embodiment, the adhesive is two-sided tape.

A principal application of the present invention is in a display device including an EMI-shielded video board which is supported by the foil-wrapped block of foam. The conductive foil disposed on the foam block provides an electrical pathway to ground from the EMI-shielded video board.

The present invention also encompasses the method of supporting a component of an electronic device and providing and electrical pathway from that component with the block of foam on which conductive foil is disposed. Finally, the present invention also encompasses the method of making a device for supporting a component of an electronic device and providing an electrical pathway to ground from that component by disposing a conductive foil which forms the desired electrical pathway on a block of foam.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

As noted above, the present invention was achieved in order to replace the functionality of the relatively expensive spring used in television and video monitor manufacture to both support a video board and provide a path to ground for the EMI shielding of that video board and related components. The inventor herein has discovered that the spring in question can be replaced by a block of foam with a conductive metal foil provided on the surface of the foam block. The foam supports and cushions the electronic component, such as a video board. The foil provides the desired electrical pathway to ground.

Figure 1:
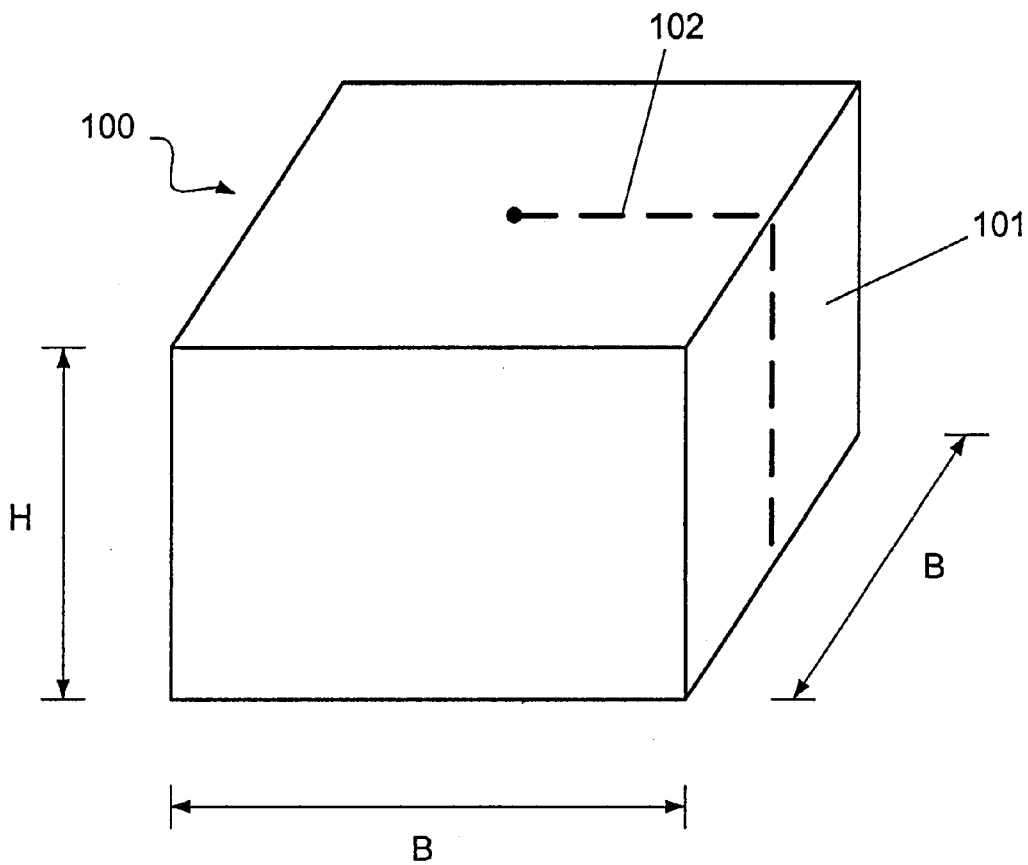
FIG. 1 is an illustration of a device according to the present invention for simultaneously supporting a video board and providing a path to ground for EMI shielding of the video board.

As shown in FIG. 1, the device of the present invention may be embodied as a block of foam (100) with conductive metal foil (101) provided on the surface of the block (100). The foam used is preferably urethane, and the conductive metal foil used may be aluminum foil.

Figure 3:
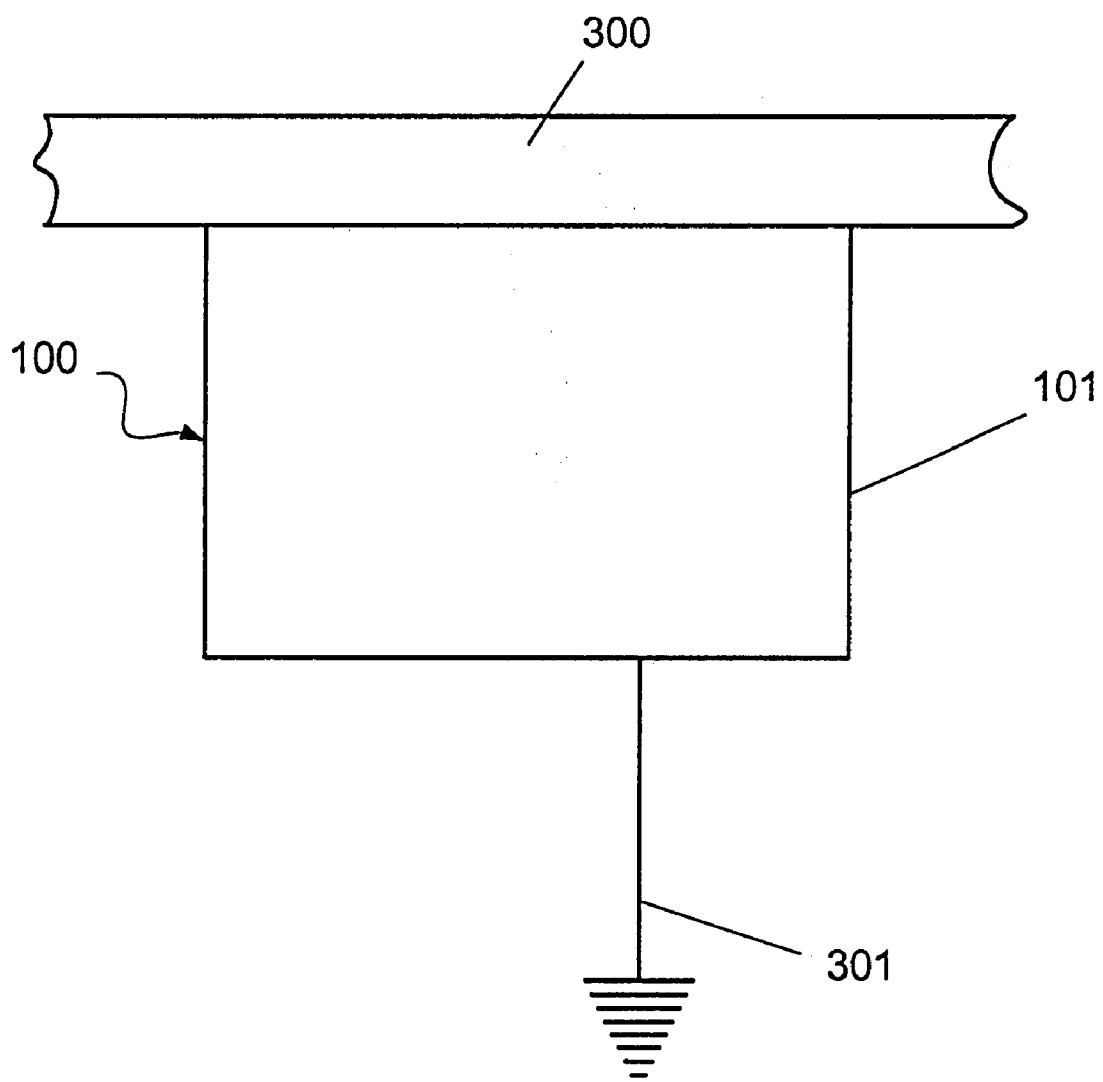
FIG. 3 is an illustration of the device of FIG. 1 being used to support and ground a video board in a display device.

The block of foam (100) can be used to support the video board of a display device, such as a television or monitor, with much the same effect of the replaced spring. The foil (101) is provided on the surface of the block (100) so as to provide an electrical pathway (102) that extends preferably from a top surface of the block (100) to a bottom surface as shown in FIG. 1. In this way, the EMI shielding of the video board and related components can be electrically connected to the electrical pathway (102) of the block (100). Preferably, the EMI shielding is electrically connected to the top surface of the block (100), while the pathway (102) at the bottom of the block (100) is electrically connected to ground as shown in FIG. 3.

In a specific application, the block (100) is square when viewed from above, with a height (H) equal to ⅔ the length of the base sides (B). For example, the base sides (B) may have a length of 15 mm while the height of the block (100) may be 10 mm.

Figure 2:
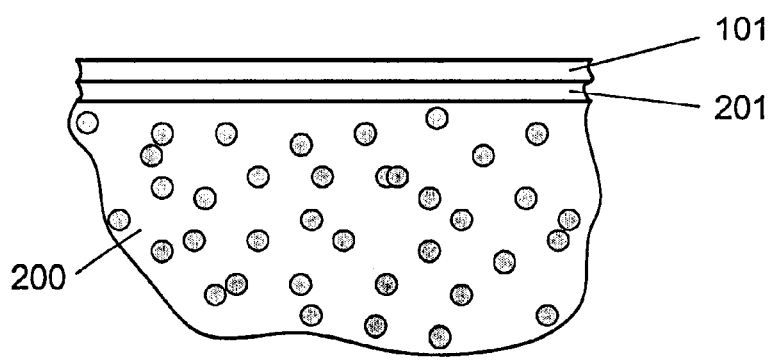
FIG. 2 is a cut out section of the device of FIG. 1 showing a cross section of the constituent members thereof.

FIG. 2 illustrates a cut-out cross-section of a surface portion of the block (100). As noted above, the block (100) is made of a urethane foam (200) with a conductive metal foil (101) disposed on at least some portions of the surface of the block (100) so as to create the electrical pathway (102). Between the foam (200) and the foil (101), a layer of adhesive (201) is provided to retain the foil (101) on the surface of the foam (200). The adhesive (201) may be any adhesive answering this purpose.

In a preferred embodiment, however, the adhesive (201) is double sided tape. This allows the foam (200) and adhesive tape (201) to be assembled and shipped with the backing being retained on the outer surface of the tape (201). The outer surface of the tape (201) can then be exposed when necessary by removing the backing so that the metal foil (101) can be adhered thereto.

To reduce the amount of foil (101) needed, the foil (101) may be applied on only three of the four sides of the cube (100). This still allows sufficient electrical pathways for the application of grounding a video board (300).

This metal foil cushion can be used to ground two relatively parallel conductive surfaces or edges. It can also be used to help attenuate EMI emissions from electronic equipment. At the same time, it can serve as a conductive spring, allowing relative deflection between two conductive surfaces or edges without loosing electrical contact.

It has also been discovered that it is advantageous to provide the adhesive (201) on only the top and bottom surfaces of the block (100). This reduces the cost of the adhesive, but still provides adequate adhesion between the foil (101) and the block (100). Additionally, there is less risk of permanently deforming the block (100) if the foil (101) must only be pressed against the adhesive from the top and bottom of the block (100), rather than from the sides of the block (100) as well.

FIG. 3 is an illustration of the device of the present invention in use to support and ground an EMI-shielded video board (300) in a display device. As shown in FIG. 3, the video board (300) rests on an upper surface of the block (100). The lower surface of the block (100) is provided with an electrical connection to ground (301). The conductive foil (101) electrically connects the upper and lower surfaces of the block (100), completing the pathway to ground.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A device for both supporting a component of an electronic device and providing and electrical pathway from said component, the device comprising:

a block of foam, said block being square when viewed from above and having top and bottom opposing surfaces; and a conductive foil providing said electrical pathway disposed on said block, wherein an adhesive is located only on said top and bottom surfaces.

2. The device of claim 1, wherein adhesive is between said foam and said foil.

3. The device of claim 2, wherein said adhesive is two-sided tape.

4. The device of claim 1, wherein said foil is aluminum.

5. The device of claim 1, wherein said foam is urethane.

6. A display device comprising:

an EMI-shielded circuit board;

a block of foam for supporting said circuit board, said block being square when viewed from above and having top and bottom opposing surfaces; and a conductive foil disposed on said block for grounding said circuit board, wherein an adhesive is located only on said top and bottom surfaces.

7. The device of claim 6, wherein adhesive is between said foam and said foil.

8. The device of claim 6, wherein said foil is aluminum.

9. The device of claim 6, wherein said foam is urethane.

10. The device of claim 6, wherein said adhesive is two-sided tape.

11. A method of both supporting a component of an electronic device and providing and electrical pathway from said component, the method comprising:

locating an adhesive only on said top and bottom opposing surfaces of a block of foam, said block being square when viewed from above; and supporting said component with said block on which a conductive foil is disposed providing said electrical pathway.

12. A method of making a device for both supporting a component of an electronic device and providing and electrical pathway from said component, the method comprising:

locating an adhesive only on said top and bottom opposing surfaces of a block of foam, said block being square when viewed from above; and disposing a conductive foil which forms said electrical pathway on said block.

13. The method of claim 12, further comprising adhering said foil to said foam with a layer of adhesive between said foam and said foil.

14. The method of claim 13, wherein said adhesive is two-sided tape.

15. The method of claim 12, wherein said disposing said foil further comprises placing aluminum foil on said foam block.

16. The method of claim 12, further comprising forming said foam block from urethane.

17. The method of claim 12, wherein said disposing said foil comprises disposing foil on at least a portion of a top, a bottom and three sides of said foamblock.

18. A method of making a display device comprising;

locating an adhesive only on said top and bottom opposing surfaces of a block of foam, said being square when viewed from above: and supporting an EMI-shielded circuit board with said block having a conductive foil disposed thereon for grounding said circuit board.

19. The method of claim 18, further comprising adhering said foil to said foam with said adhesive between said foam and said foil.

20. The method of claim 19, wherein said adhesive is two-sided tape.

21. The method of claim 18, further comprising using aluminum foil as said foil on said foam block.

22. The method of claim 18, further comprising forming said foam block from urethane.

\* \* \* \* \*